United States Patent
Nakayama

(10) Patent No.: US 11,647,621 B2
(45) Date of Patent: May 9, 2023

(54) FEEDING SYSTEM FOR COMPONENTS IN A SCATTERED STATE

(71) Applicant: FUJI CORPORATION, Chiryu (JP)

(72) Inventor: Daisuke Nakayama, Toyokawa (JP)

(73) Assignee: FUJI CORPORATION, Chiryu (JP)

( * ) Notice: Subject to any disclaimer, the term of this patent is extended or adjusted under 35 U.S.C. 154(b) by 359 days.

(21) Appl. No.: 16/646,234

(22) PCT Filed: Sep. 15, 2017

(86) PCT No.: PCT/JP2017/033497
§ 371 (c)(1),
(2) Date: Mar. 11, 2020

(87) PCT Pub. No.: WO2019/053888
PCT Pub. Date: Mar. 21, 2019

(65) Prior Publication Data
US 2020/0275590 A1    Aug. 27, 2020

(51) Int. Cl.
*H05K 13/02* (2006.01)
*H05K 13/04* (2006.01)
(Continued)

(52) U.S. Cl.
CPC ........... *H05K 13/028* (2013.01); *B65G 47/90* (2013.01); *H05K 13/0409* (2018.08); *H05K 13/0812* (2018.08); *H05K 13/0882* (2018.08)

(58) Field of Classification Search
CPC ............ H05K 13/028; H05K 13/0409; H05K 13/0812; H05K 13/0882; H05K 13/043;
(Continued)

(56) References Cited

U.S. PATENT DOCUMENTS

| 6,056,108 A * | 5/2000 | Buchi ................. B25J 9/1697 198/395 |
| 2014/0121836 A1* | 5/2014 | Ban .................... B25J 9/0093 700/259 |

(Continued)

FOREIGN PATENT DOCUMENTS

| EP | 0 916 457 A2 | 5/1999 |
| EP | 0 916 457 A3 | 5/1999 |

(Continued)

OTHER PUBLICATIONS

Extended European Search Report dated Aug. 7, 2020 in corresponding European Patent Application No. 17925295.2, 8 pages
(Continued)

*Primary Examiner* — Richard A Hansell, Jr.
(74) *Attorney, Agent, or Firm* — Oblon, McClelland, Maier & Neustadt, L.L.P.

(57) ABSTRACT

A component feeding system including: a stage configured to support components in a scattered state; a holding tool configured to pick up and hold the component scattered on the stage; an imaging device configured to image the components scattered on the stage; and a control device configured to acquire, based on image data of the imaging device, a pickup possible component quantity that is a quantity of components that can be picked up by the holding tool from among the components scattered on the stage.

3 Claims, 11 Drawing Sheets

(51) Int. Cl.
*H05K 13/08* (2006.01)
*B65G 47/90* (2006.01)

(58) Field of Classification Search
CPC ............ H05K 13/0813; H05K 13/086; H05K 13/022; B65G 47/90
See application file for complete search history.

(56) References Cited

U.S. PATENT DOCUMENTS

| | | |
|---|---|---|
| 2018/0049352 A1 | 2/2018 | Matsumoto et al. |
| 2018/0064004 A1* | 3/2018 | Matsumoto .......... H05K 13/081 |
| 2019/0133006 A1 | 5/2019 | Matsumoto et al. |
| 2019/0239399 A1 | 8/2019 | Matsumoto et al. |
| 2020/0146193 A1 | 5/2020 | Matsumoto et al. |

FOREIGN PATENT DOCUMENTS

| | | | |
|---|---|---|---|
| JP | 10-202569 A | 8/1998 | |
| JP | 2014-87913 A | 5/2014 | |
| WO | WO 2016/139742 A1 | 9/2016 | |
| WO | WO 2016/147331 A1 | 9/2016 | |
| WO | WO-2016135909 A1 * | 9/2016 | ............ B25J 11/00 |
| WO | WO-2016139742 A1 * | 9/2016 | .......... H05K 13/022 |

OTHER PUBLICATIONS

International Search Report dated Dec. 12, 2017 in PCT/JP2017/033497 filed Sep. 15, 2017, 2 pages

* cited by examiner

FEEDING SYSTEM FOR COMPONENTS IN A SCATTERED STATE

TECHNICAL FIELD

The present disclosure relates to a component feeding system provided with a stage on which components are scattered.

BACKGROUND ART

As described in the following patent literature, there are component feeding systems that supply components scattered on a stage.

CITATION LIST

Patent Literature

Patent literature 1: JP-A-H10-202569

BRIEF SUMMARY

Technical Problem

It is an object of the present disclosure to provide a component feeding system in which components on a stage are appropriately supplied.

Solution to Problem

To solve the above problems, disclosed herein is a component feeding system including: a stage configured to support components in a scattered state; a holding tool configured to pick up and hold the component scattered on the stage; an imaging device configured to image the components scattered on the stage; and a control device configured to acquire, based on image data of the imaging device, a pickup possible component quantity that is a quantity of components that can be picked up by the holding tool from among the components scattered on the stage.

Advantageous Effects

According to the present disclosure, since the quantity of components that can be held by the holding tool among the components scattered on the stage is determined based on the image data of the imaging device, the components on the stage can be appropriately supplied.

DESCRIPTION OF EMBODIMENTS

The following describes in detail referring to the figures an example embodiment of the present disclosure.

(A) Configuration of Component Mounter

Figure 1:
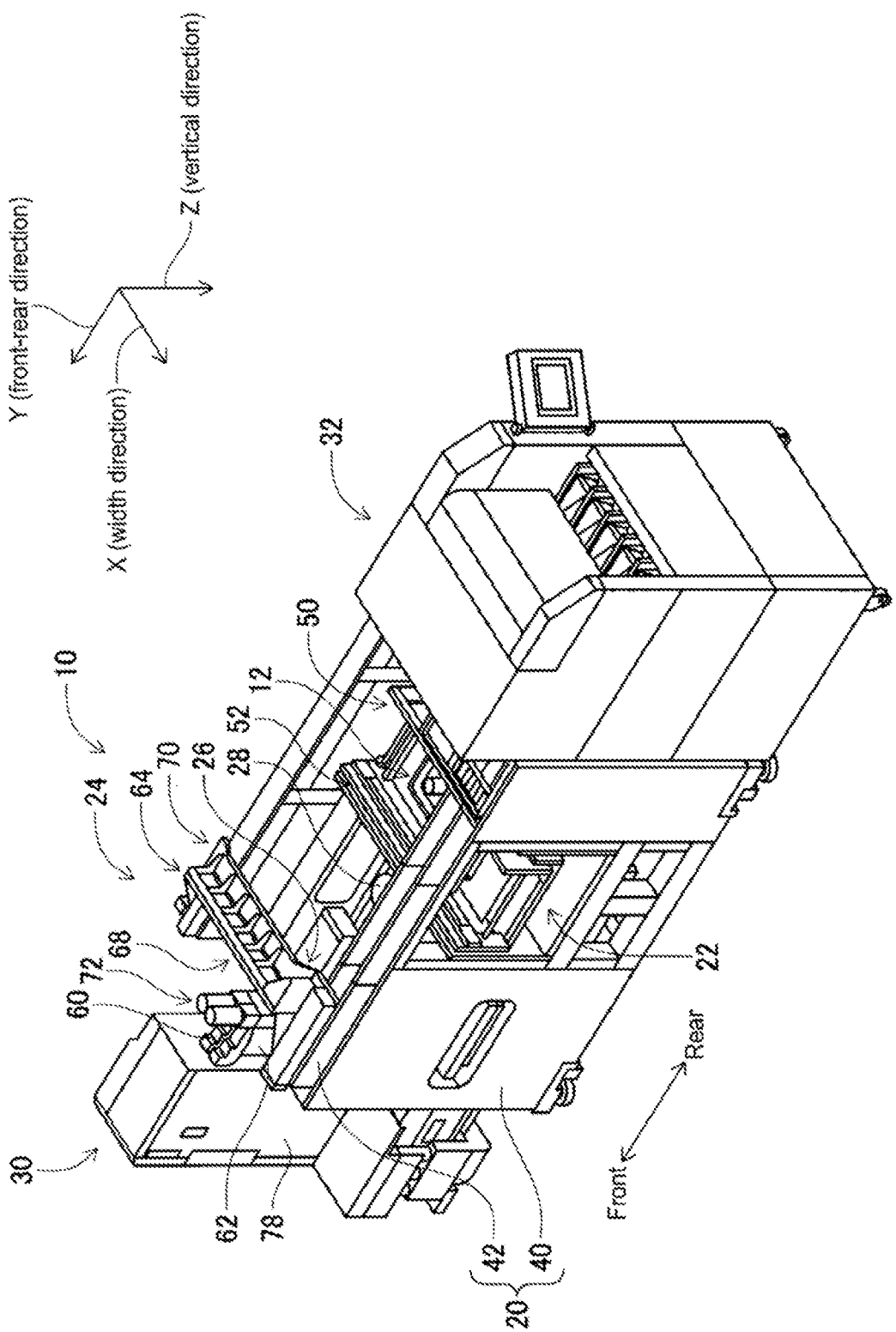
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 11). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
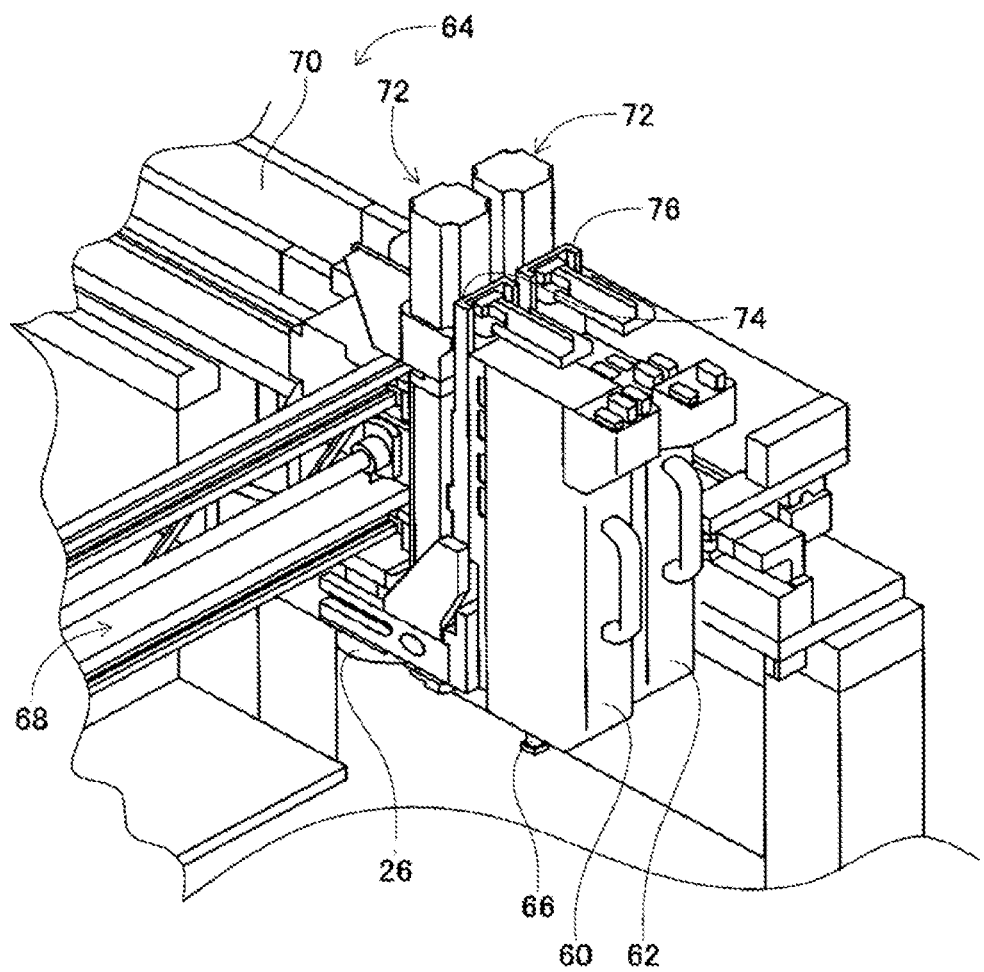
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
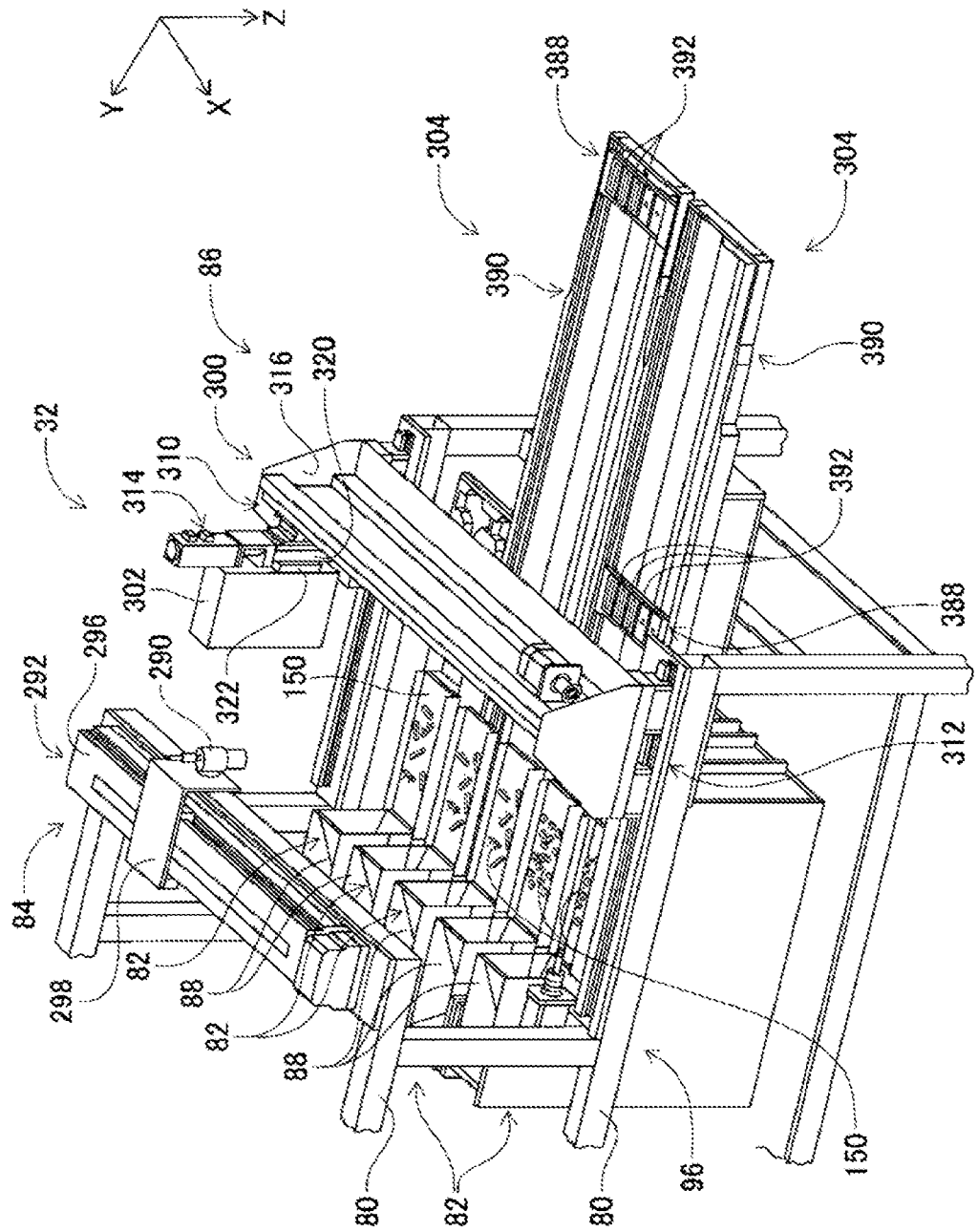
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 4), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

Figure 4:
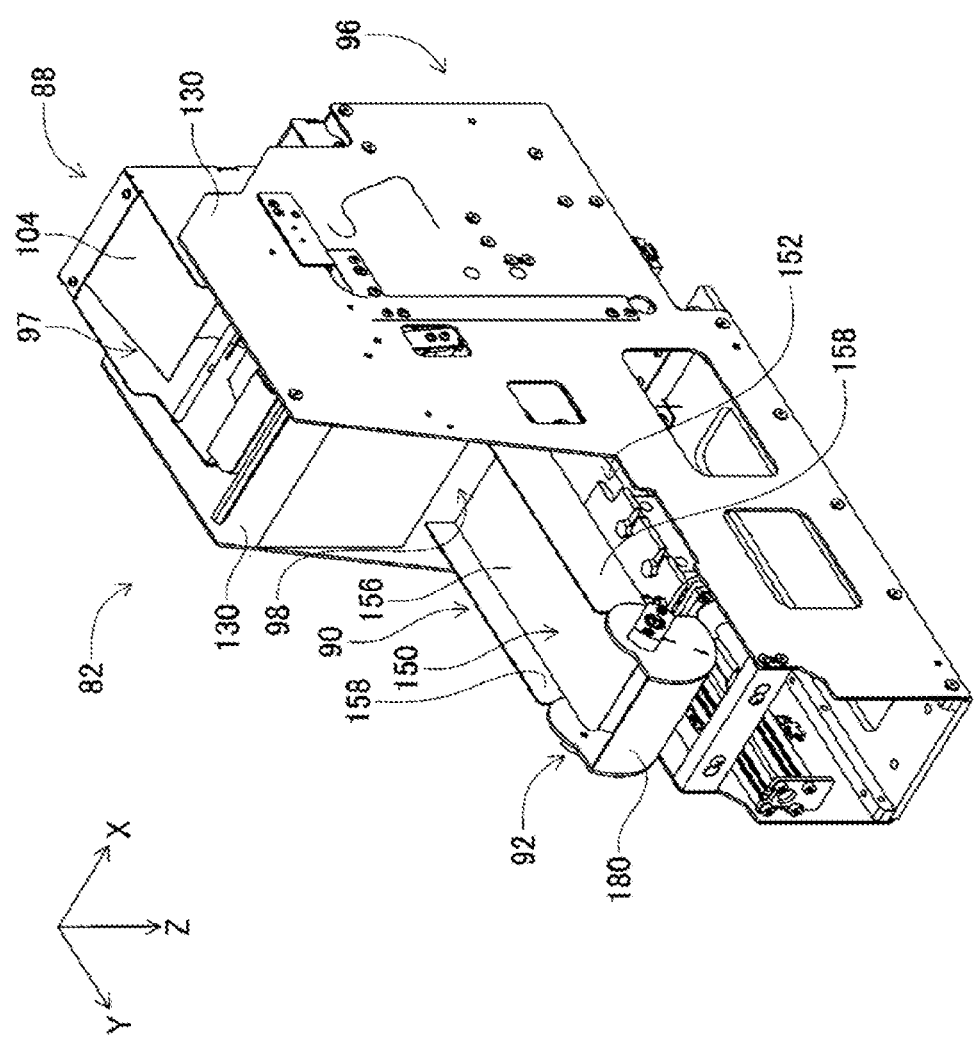
FIG. 4 is a perspective view of a component supply unit.
Figure 5:
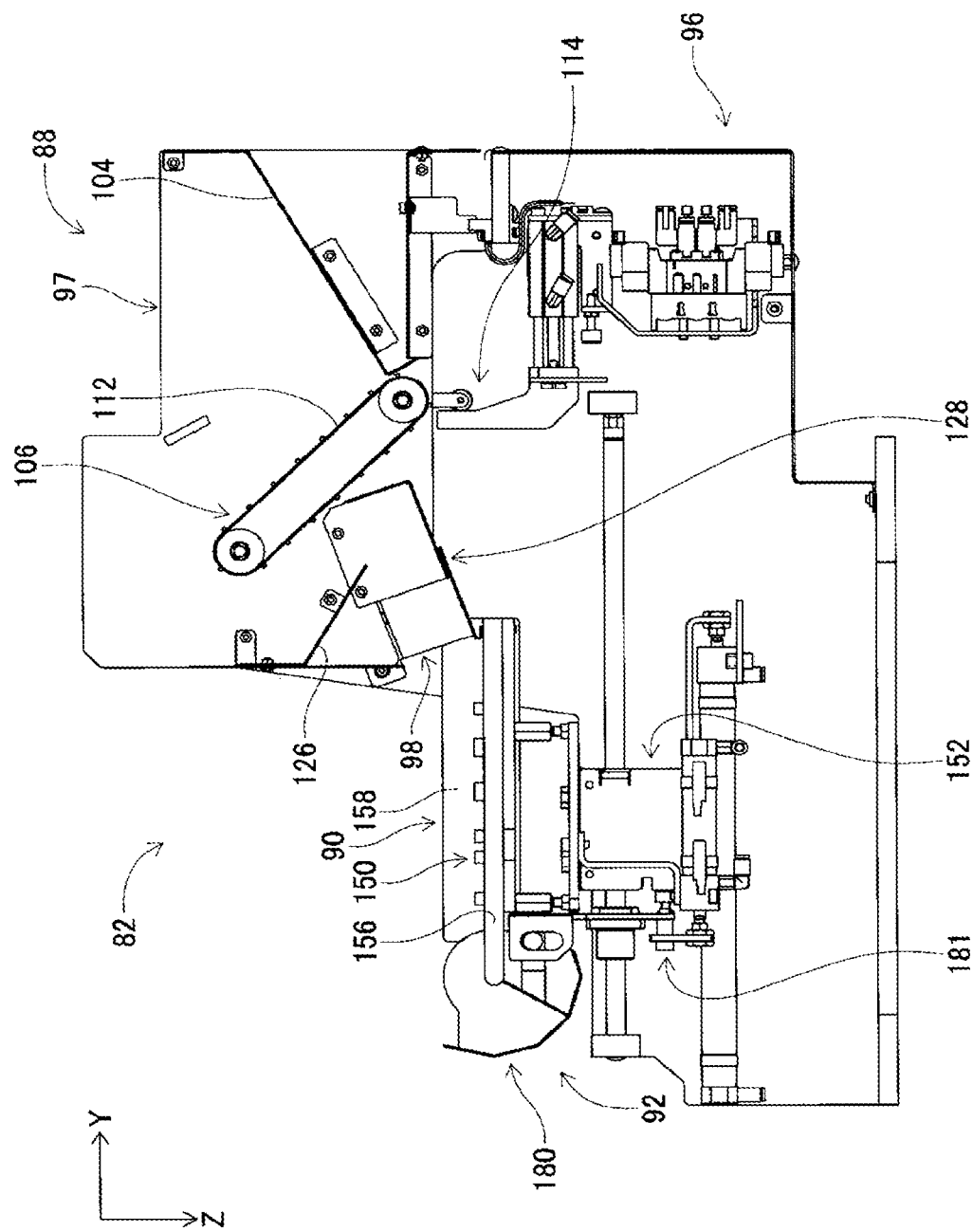
FIG. 5 is a transparent cross section view of the component supply unit.

As shown in FIGS. 4 and 5, component supply apparatus 88 is a substantially cuboid box arranged to extend in the Y direction. Note that, the Y direction is referred to as the front-rear direction of component supply apparatus 88, the direction toward the side on which component return device 92 is arranged in component supply unit 82 is referred to as the front, and the direction toward the side on which component supply apparatus 88 is arranged is referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged so as to incline downward from the rear end surface of component supply apparatus 88 toward the center.

Also, as shown in FIG. 5, conveyor device 106 is arranged at the front side of inclined plate 104. Conveyor device 106 is arranged so as to be inclined upward from the front side end of inclined plate 104 toward the front of component supply apparatus 88. Note that, conveyor belt 112 of conveyor device 106 rotates counterclockwise in FIG. 5. In other words, the conveyance direction by conveyor device 106 is diagonally up from the front end of inclined plate 104.

Further, inclined plate 126 is arranged below the front end of conveyor device 106. Inclined plate 126 is arranged from the front end surface of component supply apparatus 88 toward the lower side of conveyor device 106, and the rear end portion is inclined downward. Further, inclined plate 128 is arranged below inclined plate 126. Inclined plate 128 is inclined such that the front end thereof is positioned downward from below the central portion of conveyor device 106 toward discharge opening 98 of component supply apparatus 88.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Figure 11:
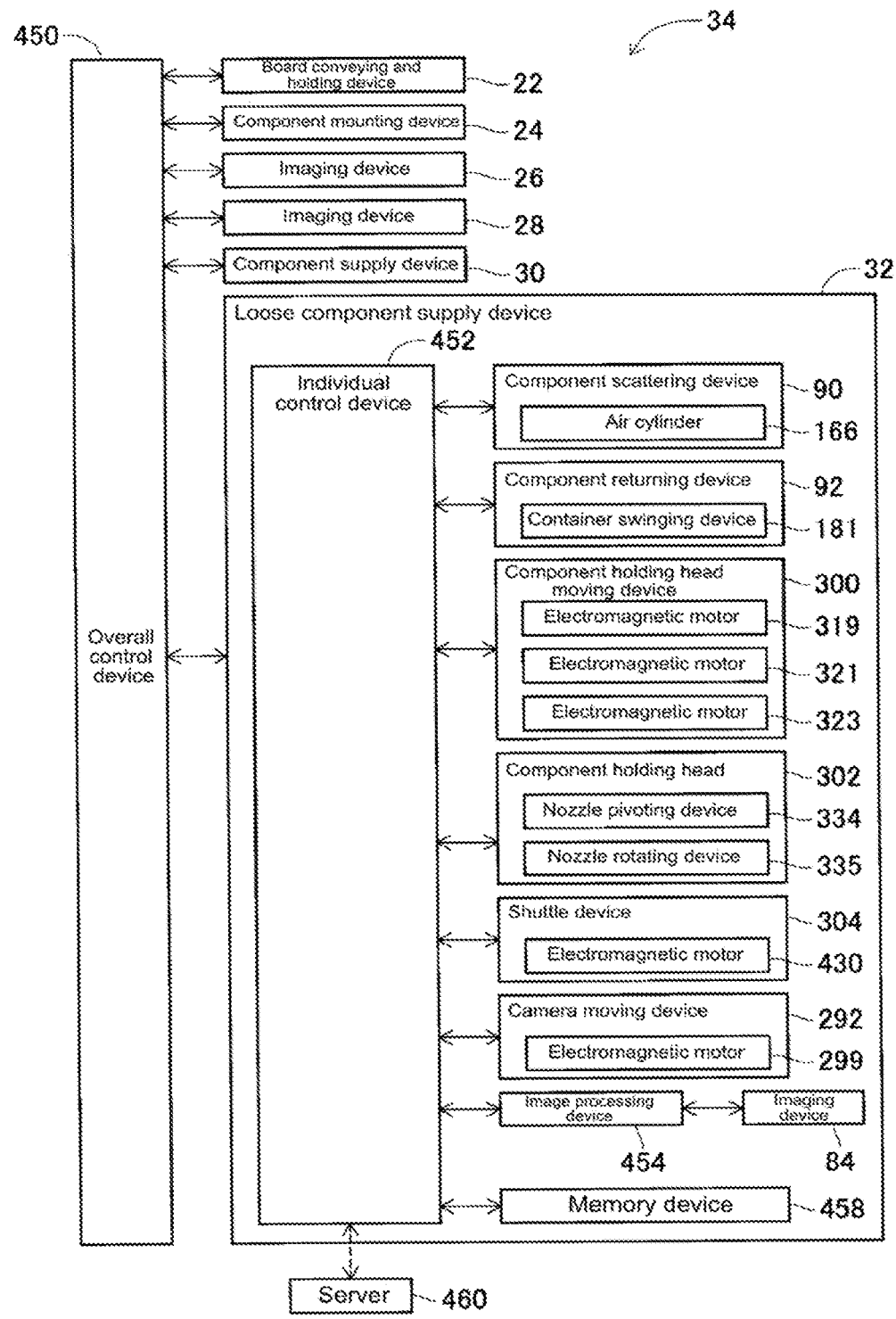
FIG. 11 is a block diagram showing a control device of the component mounter.

Further, component support member moving device 152 slides component support member 150 in the Y direction by operation of air cylinder 166 (see FIG. 11). Here, component support member 150 moves between a stored state (see FIG. 6) stored below component supply apparatus 88 and an exposed state (see FIG. 5) drawn out from under component supply apparatus 88.

Figure 7:
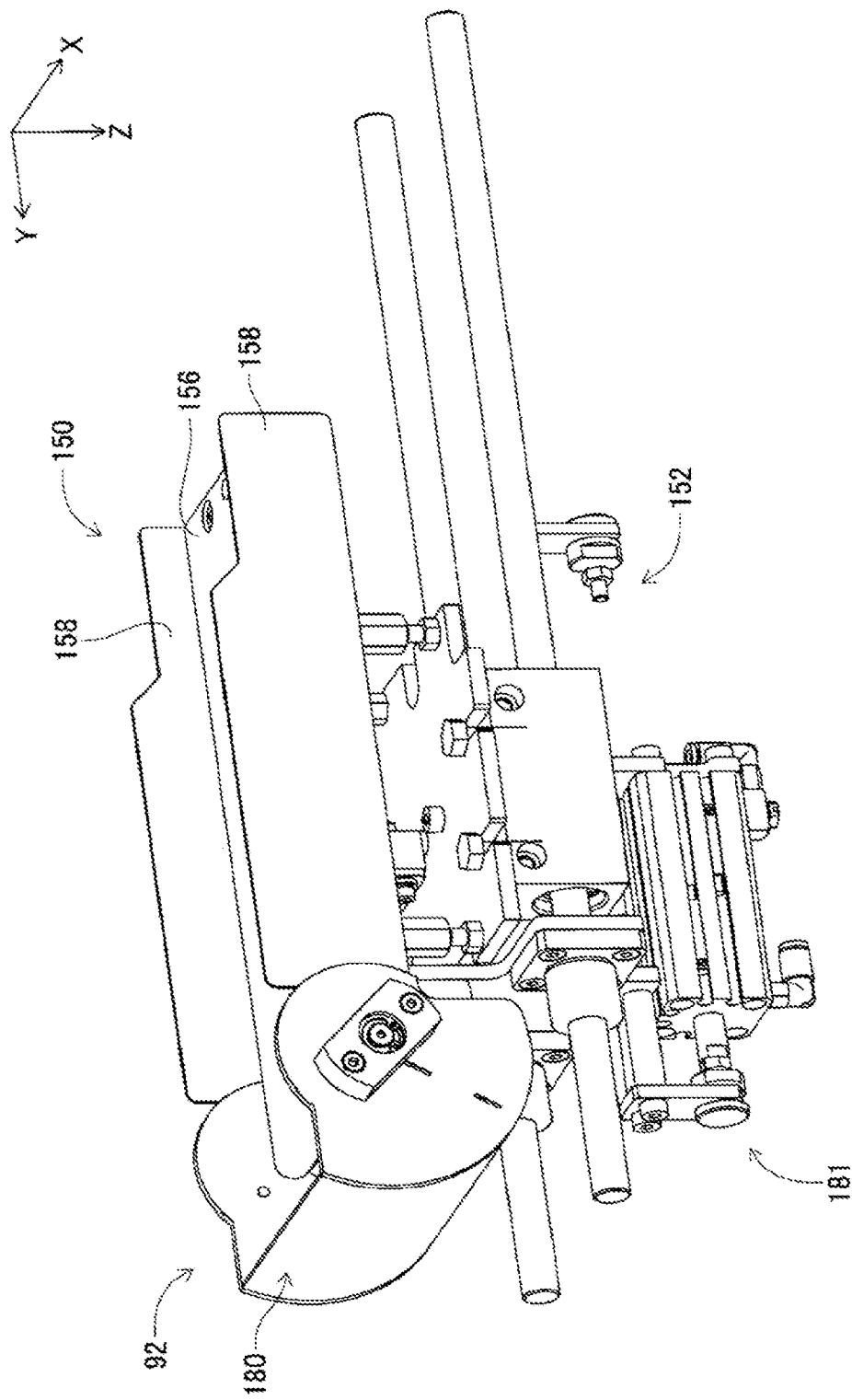
FIG. 7 is a perspective view of a component scattering device.
Figure 8:
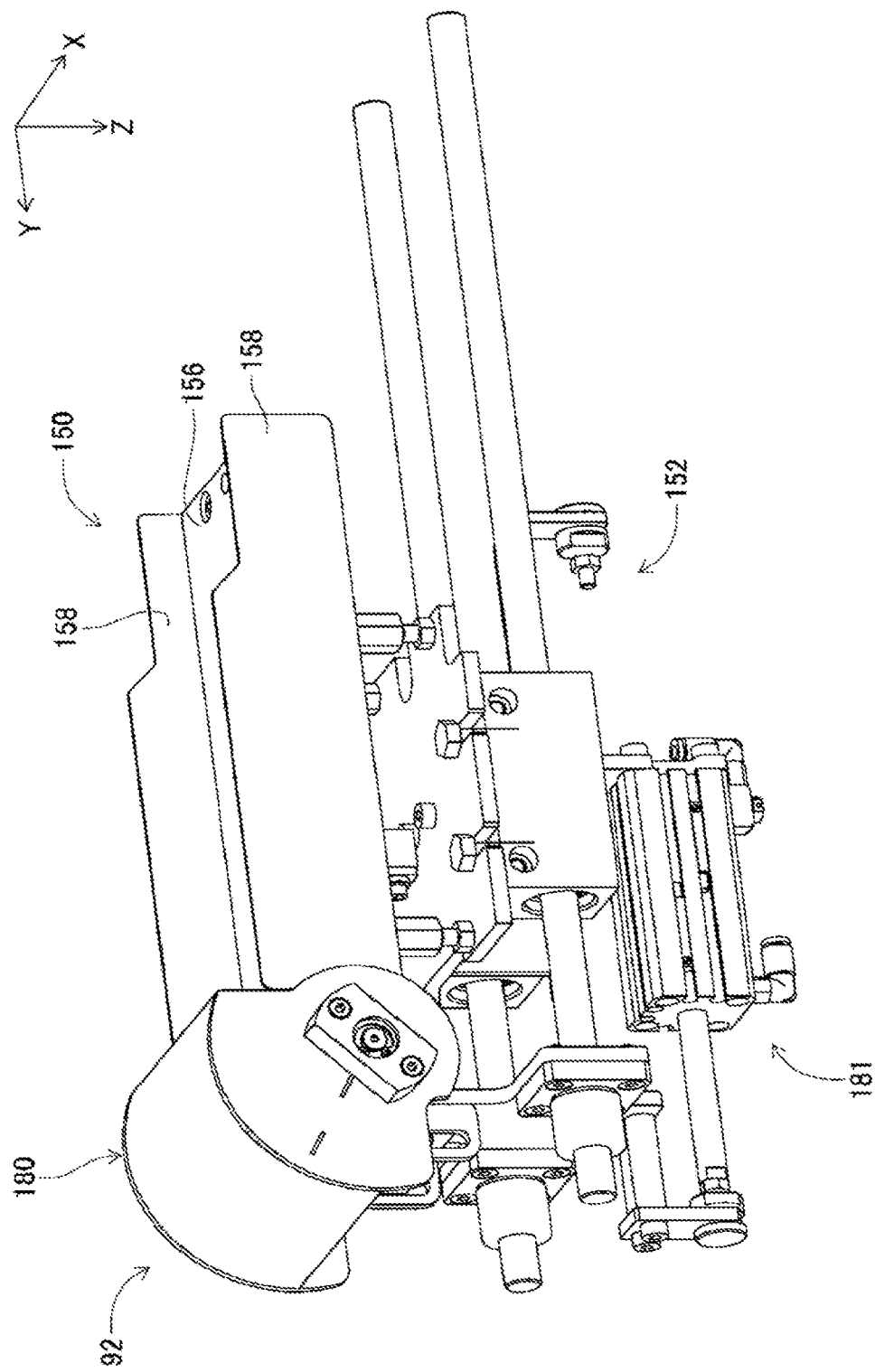
FIG. 8 is a perspective view of a component scattering device.

As shown in FIG. 7, component returning device 92 includes component storage container 180 and container oscillating device 181. Component storage container 180 is a box with an arc-shaped bottom surface. Component storage container 180 is held to be swingable around the front end of stage 156 of component support member 150 and is swung by operation of container oscillating device 181. Here, component storage container 180 is swung between a storing orientation (refer to FIG. 7) with the opening facing up, and a return orientation (refer to FIG. 8) with the opening facing the upper surface of stage 156 of component support member 150.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 11). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 11). X-direction moving device 310 includes X slider 320 provided on a side surface of Y slider 316, and X slider 320 is moved to any position in the X direction by operation of electromagnetic motor 321 (refer to FIG. 11). Z-direction moving device 314 includes Z slider 322 provided on a side surface of X slider 320, and Z slider 322 is moved to any position in the Z direction by operation of electromagnetic motor 323 (refer to FIG. 11).

Figure 9:
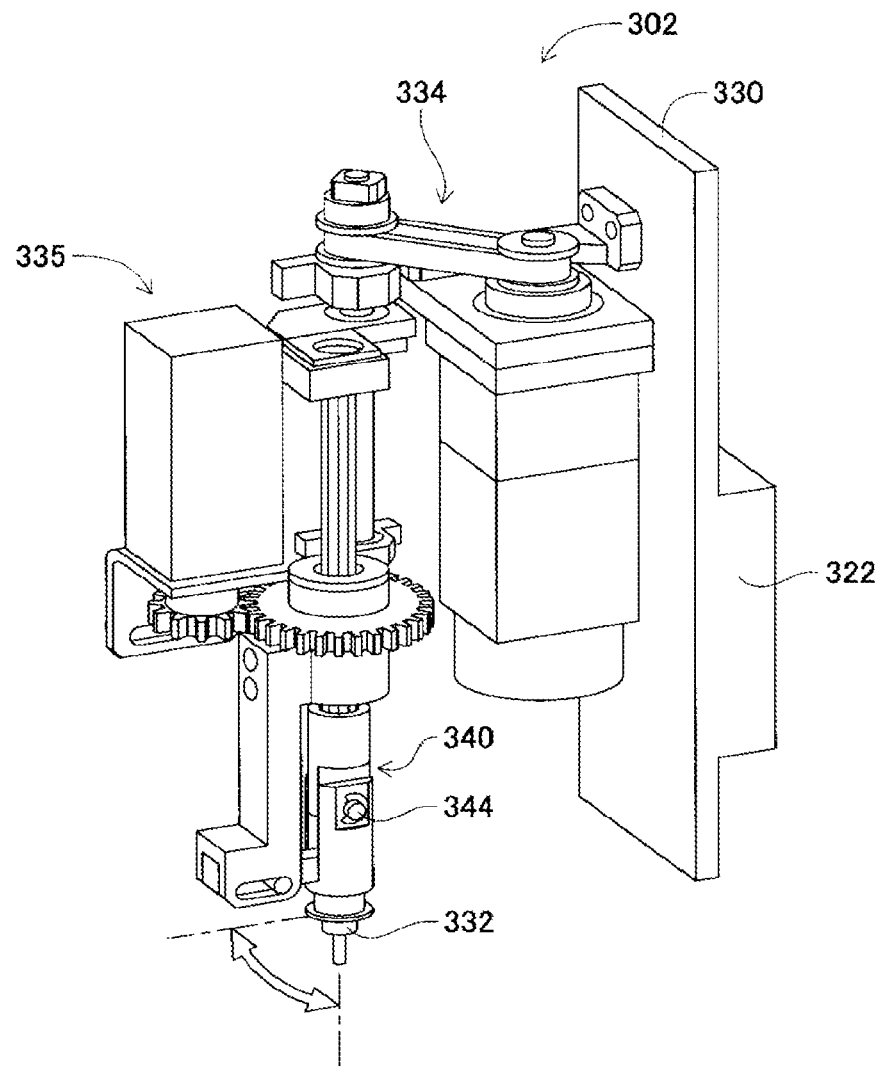
FIG. 9 is a perspective view of a component holding head.

As shown in FIG. 9, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Of course, it is also possible to stop the positioning at an angle between the non-pivoted position and the pivoted position. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 10:
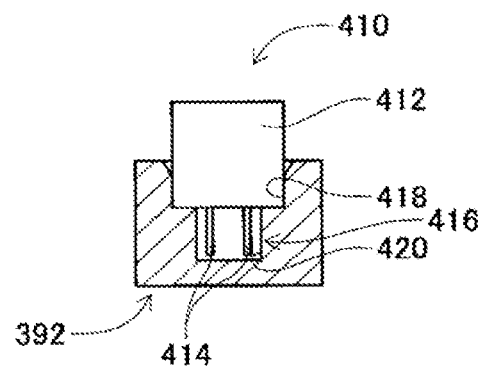
FIG. 10 shows a component receiving member in which is stored an electronic component.

Note that, loose component supply device 32 can be supplied with various components, and various forms of component receiving members 392 are prepared according to the shapes of the components. Here, regarding the electronic circuit component supplied by loose component supply device 32, a component receiving member 392 corresponding to leaded component 410 as shown in FIG. 10 will be described. Leaded component 410 is composed of a block-shaped component main body 412 and two leads 414 projecting from the bottom surface of component main body 412.

Also, component reception recess 416 is formed in component receiving member 392 in accordance with the shape of leaded component 410. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 11). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Further, as shown in FIG. 11, control device 34 includes overall control device 450, multiple individual control devices (only one is shown in the FIG. 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown).

Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

Loose component supply device 32 also has memory device 458. Memory device 458 is connected to individual control device 452, and stores various kinds of data in accordance with a command from individual control device 452. Further, individual control device 452 communicates with server 460 provided outside component mounter 10, and can transmit and receive various kinds of data to and from server 460.

(B) Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

(C) Loose Component Supply Device Operation (a) Supplying Leaded Components with Loose Component Supply Device With loose component supply device 32, leaded components 410 are inserted by an operator into insertion opening 97 of component supply apparatus 88, then, the inserted leaded components 410 are supplied in a state loaded on component receiving member 392 of component carrier 388 by operation of component supply unit 82 and component transfer device 86.

In detail, the operator inserts leaded components 410 via insertion opening 97 at the top of component supply apparatus 88. Here, component support member 150 is moved below component supply apparatus 88 by operation of component support member moving device 152 to be in a stored state (refer to FIG. 6). With component support member 150 in a stored state, component storage container 180 positioned at the front end of component support member 150 is positioned in front of component supply apparatus 88, and the opening of component storage container 180 is oriented facing up (storing orientation).

Figure 6:
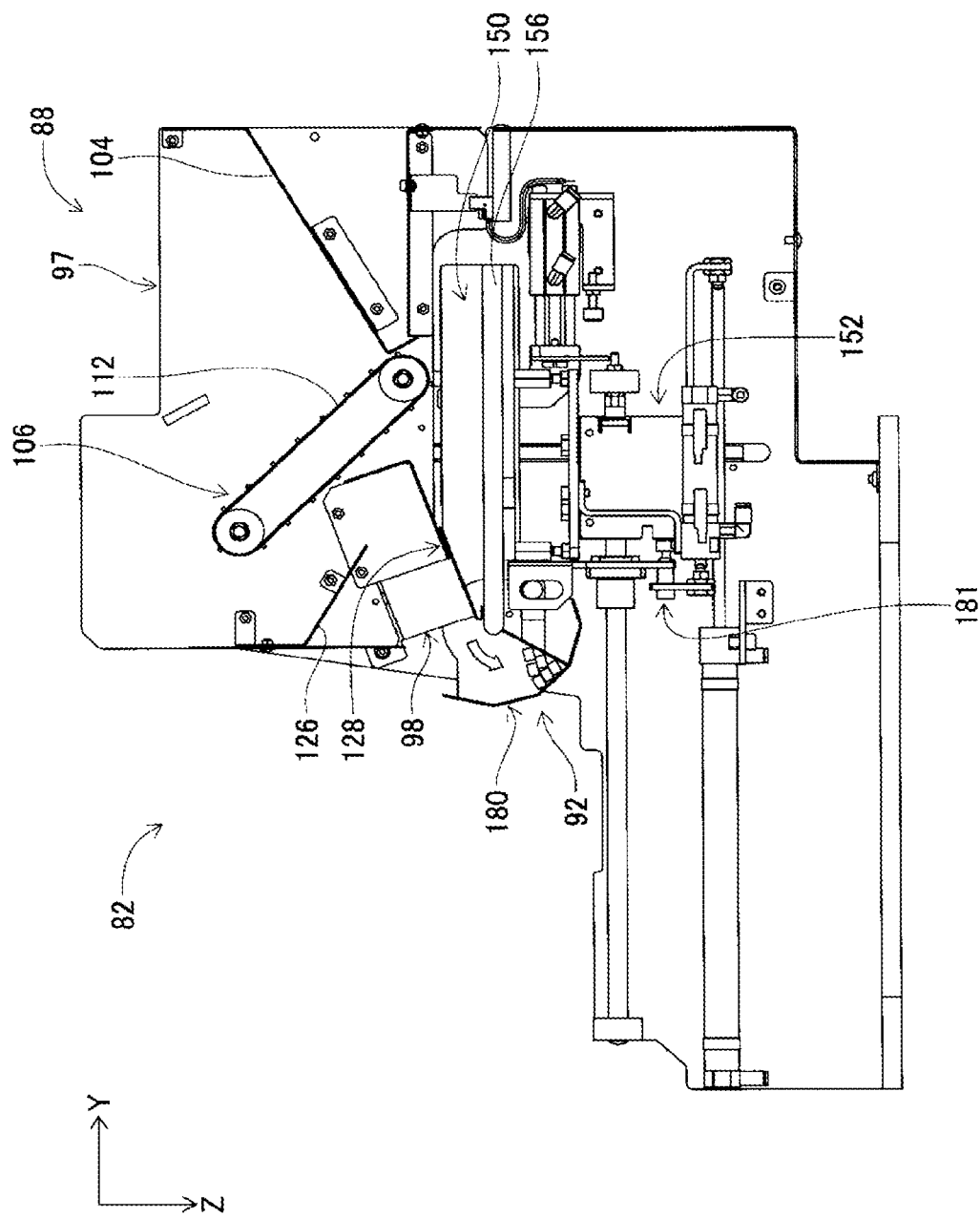
FIG. 6 is a transparent cross section view of the component supply unit.

Leaded components 410 inserted via insertion opening 97 on the top surface of component supply apparatus 88 fall onto inclined plate 104 of component supply apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. Then, by operating conveyor device 106, conveyor belt 112 of conveyor device 106 is rotated counterclockwise as shown in FIG. 6. By this, leaded components 410 piled up between inclined plate 104 and conveyor belt 112 are conveyed by conveyor belt 112 diagonally up and forward.

Then, leaded components 410 conveyed by conveyor belt 112 drop from the upper front end of conveyor device 106 onto inclined plate 126. Leaded components 410 that have fallen onto inclined plate 126 roll towards the rear of inclined plate 126 onto inclined plate 128. Then, leaded components 410 that have fallen onto inclined plate 128 roll towards the front and are discharged from discharge opening 98 at the front of component supply apparatus 88.

By this, leaded components 410 discharged from discharge opening 98 of component supply apparatus 88 are stored inside component storage container 180. Then, when a predetermined amount of leaded components 410 have been discharged from component supply apparatus 88, that is, when the conveyor device 106 has been operated by a specified amount, conveyor device 106 is stopped. Next, component support member 150 is moved from the stored state towards the front by the operation of component support member moving device 152.

Also, when component support member 150 has been moved forward from the stored state by a specified amount, container swinging device 181 of component returning device 92 is operated and component storage container 180 is swung. Accordingly, the orientation of component storage container 180 is changed suddenly from an orientation with the opening of facing up (storing orientation) to an orientation with the opening facing stage 156 (returning orientation). In this case, leaded components 410 collected in component storage container 180 are discharged with strong force towards stage 156. As a result, leaded components 410 are scattered from component storage container 180 onto stage 156.

Figure 12:
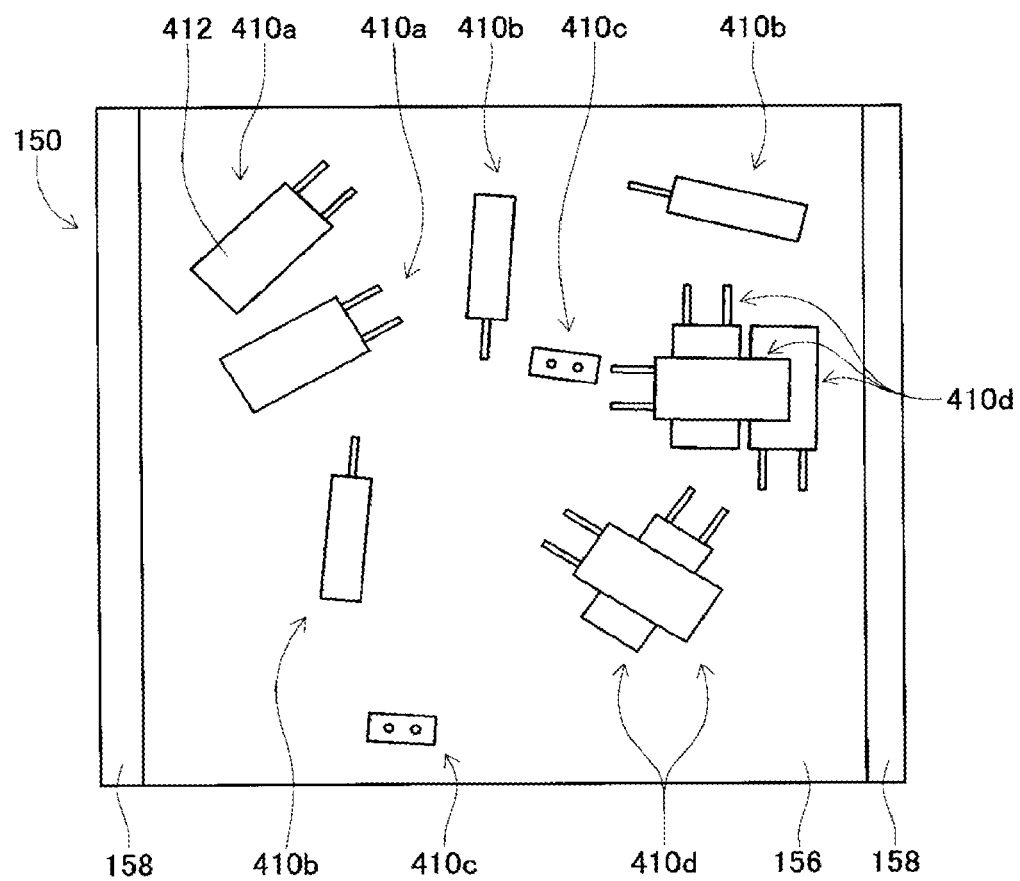
FIG. 12 shows leaded components scattered on a stage.

Note that, when leaded components 410 are scattered on stage 156 of component support member 150, as shown in FIG. 12, leaded components 410 are scattered on stage 156 in largely four orientations. Specifically, as a first orientation, leaded components 410 are scattered in an orientation in which the surface from which leads 414 extend faces sideways and the two leads 414 are aligned in a generally horizontal direction. Further, as a second orientation, leaded components 410 are scattered in an orientation in which the surface from which leads 414 extend faces sideways and the two leads 414 are aligned in a generally vertical direction. Further, as a third orientation, leaded components 410 are scattered in an orientation in which the surface from which leads 414 extend faces upwards. Further, as a fourth orientation, leaded components 410 are scattered such that two or more leaded components 410 overlap with each other. Note that, when distinguishing between orientations of scattered leaded components 410, components are given as leaded component 410a in a first orientation, leaded component 410b in a second orientation, leaded component 410c in a third orientation, and leaded component 410d in a fourth orientation.

When leaded components 410 are scattered on stage 156 as above, camera 290 of imaging device 84, by operation of camera moving device 292, moves above component support member 150. Then, leaded components 410 scattered on stage 156 are imaged by camera 290. Note that, since the viewing angle of camera 290, that is, the imaging range, is wider than stage 156, the entire stage 156, that is, all the leaded components 410 scattered on stage 156, are imaged by one imaging. Then, based on the image data imaged by camera 290, a leaded component that is a target for pickup (also referred to as "pickup target component") is identified by pattern matching.

Figure 13:
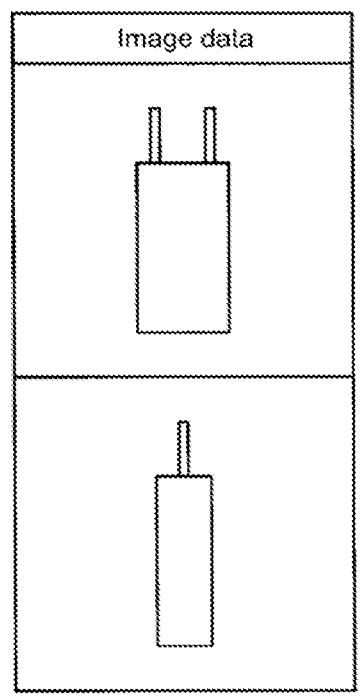
FIG. 13 shows leaded components recognized by pattern matching.

Specifically, based on the image data of leaded component 410 captured by camera 290, outer edge lines (outline) of leaded component 410 are identified, and the shape of the upper surface of leaded component 410, that is, the shape of leaded component 410 as seen from above, is calculated. Further, based on the image data, the position of leaded component 410 is calculated. On the other hand, as shown in FIG. 13, memory device 458 memorizes image data of the shape according to the outer edge lines of lead component 410a in the first orientation (hereinafter also sometimes referred to as "first orientation component image data"), and image data of the shape according to the outer edge lines of lead component 410b in the second orientation (hereinafter also sometimes referred to as "second orientation component image data")

Then, it is determined whether the shape of the upper surface of leaded component 410 calculated based on the image data (hereinafter also sometimes referred to as "image component shape") matches the shape of leaded component 410 based on the first orientation component image data (hereinafter also sometimes referred to as "first memorized component shape") or the shape of leaded component 410 based on the second orientation component image data (hereinafter also sometimes referred to as "second memorized component shape"). Next, if the image component shape matches the first memorized component shape or the second memorized component shape, the leaded component according to that image component shape is set as a pickup target component.

That is, leaded component 410a in the first orientation and leaded component 410b in the second orientation are set as a pickup target component, and leaded component 410c in the third orientation and leaded component 410d in the fourth orientation are not set as a pickup target component. This is because, with leaded component 410c in the third orientation, leads 414 are arranged on the upper surface, meaning that the leaded component 410 cannot be appropriately held by suction nozzle 332 due to the leads 414 getting in the way. Further, with leaded components 410d in the fourth orientation, leaded component 410 cannot be properly held by suction nozzle 332 because the upper surface of the leaded component 410d is not level.

The position information of leaded component 410 set as the pickup target component is calculated based on the image pickup data. Then, based on the calculated position information of the pickup target components, component holding head 302 is moved above a pickup target component by operation of component holding head moving device 300 and the pickup target component is picked up using suction nozzle 332. Note that, when the pickup target component is picked up and held by suction nozzle 332, suction nozzle 332 is in the non-pivoted position.

Then, after holding leaded component 410 using suction nozzle 332, component holding head 302 is moved above component carrier 388. Here, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 10, leaded component 410 is loaded in component receiving member 392 with leads 414 facing vertically downwards.

Also, when leaded component 410 is loaded on component receiving member 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position to component mounter 10. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

(b) Storage of electronic components in component storage container and scattering on stage With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of leaded components 410 is performed. However, if components to be picked up are not scattered on stage 156 of component support member 150, the leaded components 410 cannot be picked up from stage 156. That is, when all the leaded components 410 determined to be able to be picked up have been picked up and only leaded components 410 determined not to be able to be picked up, or leaded components 410 for which determination was not possible, remain on stage 156, leaded components 410 cannot be picked up from stage 156.

Thus, with loose component supply device 32, in such a case, leaded components 410 remaining on stage 156 are collected in component storage container 180. Then, leaded components 410 collected into component storage container 180 are scattered again onto stage 156, and by doing so the orientation of the leaded components 410 changes such that pickup of leaded components 410 from stage 156 can be restarted.

Specifically, when all of the pickup target components on stage 156 have been picked up, component support member 150 moves toward the lower side of component supply apparatus 88 by the operation of component support member moving device 152. That is, component support member 150 is moved from the exposed state (refer to FIG. 5) towards the stored state (refer to FIG. 6). Here, component storage container 180 provided at the front end of component support member 150 is oriented such that the opening is facing up (collection orientation). Therefore, leaded components 410 on stage 156 of component support member 150 are stopped by the front end of inclined plate 128 of component supply apparatus 88 when component support member 150 moves from the exposed state to the stored state.

Further, as shown in FIG. 6, when component support member 150 reaches the stored state, leaded components 410 on stage 156 fall inside component storage container 180. By this, leaded components 410 remaining on stage 156 are collected in component storage container 180. In this manner, when leaded components 410 on the stage 156 are collected in component storage container 180, the collected leaded components 410 are replenished on stage 156.

In detail, when collection of leaded components 410 into component storage container 180 is complete, as shown in FIG. 6, component support member 150 is in the stored state. Thus, component support member 150 is moved from the stored state towards the front by the operation of component support member moving device 152. Also, when component support member 150 has been moved forward from the stored state by a specified amount, container swinging device 181 of component returning device 92 is operated and component storage container 180 is swung. Accordingly, the orientation of component storage container 180 is changed suddenly from an orientation with the opening of facing up (storing orientation) to an orientation with the opening facing stage 156 (returning orientation).

In this case, leaded components 410 collected in component storage container 180 are discharged with strong force towards stage 156. As a result, leaded components 410 are scattered from component storage container 180 onto stage 156. That is, leaded components 410 collected in component storage container 180 are scattered onto stage 156. As a result, the orientation of the supplied leaded component 410 is changed, and the leaded component 410 is picked up again from above the stage 156.

(c) Identification of the Optimum Quantity of Lead Parts

As described above, in loose component supply device 32, when all the pickup target components have been picked up from stage 156, the leaded components 410 on stage 156 are collected in component storage container 180. Then, the collected leaded components 410 are scattered again on stage 156, whereby the orientation of the leaded components 410 is changed, and the leaded components 410 are picked up again from stage 156.

Here, it is desirable for the probability to be high that a leaded component 410 scattered from component storage container 180 onto stage 156 will be in the first orientation or the second orientation, that is, that the leaded component 410 will be a pickup target component (hereinafter, referred to as "holdable probability"). If the holdable probability is high, the quantity of performing work of collecting leaded components into component storage container 180 and replenishment work of leaded components 410 from component storage container 180 onto stage 156 will be reduced. This makes it possible to reduce the time required for the collection work and the replenishment work. In addition, since leaded components 410 may be damaged by the load imparted by collection work and replenishment work, if the collection work and the replenishment work are reduced, the load on leaded components 410 can be reduced. In view of this, with loose component supply device 32, the holdable probability is calculated. Note that, the holdable probability may be calculated in any control device or server.

In detail, when supply of leaded components 410 by loose component supply device 32 is stopped, loose component supply device 32 repeatedly calculates the total quantity of leaded components 410 scattered on stage 156 (hereinafter, referred to as "scattered component quantity") and the total quantity of pickup target components of stage 156 (hereinafter, referred to as "holdable component quantity"). Note that, the holdable component quantity may be calculated in any control device or server.

In other words, a given quantity of leaded components 410 is scattered onto stage 156 from component supply apparatus 88, and those leaded components 410 are collected in component storage container 180. Next, the leaded components 410 collected in component storage container 180 are replenished onto stage 156. Work of collecting leaded components 410 into component storage container 180 and work of replenishing from component storage container 180 to stage 156 have been described above, therefore detailed descriptions thereof will be omitted.

Stage 156 replenished with leaded components 410 is imaged by camera 290 and the scattered component quantity is calculated based on the captured image data. Specifically, the area of stage 156 supplied with leaded components 410 where leaded components 410 are not loaded is calculated based on the captured image data. That is, the area of exposed locations of stage 156 (hereinafter referred to as "exposed area") is calculated. Specifically, for example, when the color of stage 156 is white and the color of leaded component 410 is black, a white portion is extracted based on the captured image data, and the area of the extracted portion is calculated as the exposed area.

Note that, camera 290 captures an image of stage 156 before leaded components 410 are scattered on stage 156, that is, when nothing is loaded on stage 156. The area of stage 156 (hereinafter referred to as "stage area") is calculated based on the captured image data. That is, for example, when the color of stage 156 is white, a white portion is extracted based on the captured image data, and the area of the extracted portion is calculated as the stage area.

Then, the calculated exposed area is subtracted from the calculated stage area, whereby the area of the locations where leaded components 410 are scattered on stage 156 is calculated. That is, the area occupied by all the leaded components 410 scattered on stage 156 (hereinafter, referred to as "total area occupied by components") is calculated. Memory device 458 stores an occupied area of one lead component 410 on stage 156 (hereinafter, referred to as "individual component occupied area") in consideration of the first to fourth orientation in which the leaded component 410 is in. Therefore, the total quantity of leaded components 410 scattered on stage 156, that is, scattered component quantity X, is calculated by dividing the total area occupied by components by the individual component occupied area.

In addition, the quantity of holdable components is calculated based on the image data used when calculating the exposed area, that is, the image data obtained by imaging stage 156 replenished with leaded components 410. Here, the first orientation component image data and the second orientation component image data (refer to FIG. 13) described above are used. Specifically, the quantity of leaded components 410 having a shape matching the first memorized component shape and the second memorized component shape is calculated based on the image data. As a result, the quantity of leaded components 410*a* in the first orientation and the quantity of leaded components 410*b* in the second orientation, that is, the quantity of lead components determined to be able to be picked up by suction nozzle 332, are calculated as holdable component quantity Y.

When scattered component quantity X and holdable component quantity Y have been calculated, the ratio of holdable component quantity Y to scattered component quantity X (Y/X) is calculated as holdable probability Z. Note that, since holdable probability Z varies depending on various conditions, holdable probability Z is calculated again after collection operation of leaded components 410 to component storage container 180 and replenishment operation from component storage container 180 to stage 156 are performed again, in order to obtain an accurate holdable probability.

That is, after the holdable probability is calculated, leaded components 410 are collected in component storage container 180, and the leaded components 410 collected in component storage container 180 are replenished onto stage 156. Then, using the above method, when scattered component quantity X and holdable component quantity Y have been calculated, the ratio of holdable component quantity Y to scattered component quantity X (Y/X) is calculated as holdable probability Z. Thus, a second holdable probability Z is calculated.

In this manner, the operation of collecting leaded component 410 into component storage container 180, operation of replenishing components from component storage container 180 to stage 156, and operation of calculating the scattered component quantity X and holdable component quantity Y are repeated multiple times, whereby multiple holdable probabilities Z are calculated. Then, an average value $Z_{av}$ (hereinafter, referred to as "holdable probability average value") of the multiple holdable probabilities Z is calculated. Note that, an average value of scattered component quantity X corresponding to the calculated holdable probability average value $Z_{av}$ is also calculated. That is, the average value $X_{av}$ (hereinafter, referred to as "average scattered component number") of the multiple scattered component quantity X used when calculating the holdable probability average value $Z_{av}$ is calculated.

Subsequently, the holdable probability average value $Z_{av}$ is calculated for a different component quantity from the calculated average scattered component quantity $X_{av}$. Specifically, after the holdable probability average $Z_{av}$ is calculated, leaded components 410 are added from component supply apparatus 88 to stage 156. That is, when it is determined that scattered component quantity X, which is the total quantity of leaded components 410 scattered on stage 156 calculated based on the imaging result, is insufficient, conveyor device 106 is operated, and leaded components 410 are further supplied from component supply apparatus 88 to the component storage container via stage 156. This increases the quantity of scattered components.

Here, when leaded components 410 are added from component supply apparatus 88 to stage 156, collection operation of leaded component 410 to component storage container 180 and replenishment operation from component storage container 180 to stage 156 are performed, and scattered component quantity X and holdable component quantity Y are calculated. Then, the ratio (Y/X) of holdable component quantity Y to scattered component quantity X is calculated as holdable probability Z. Further, collection operation of leaded components 410 into component storage container 180, replenishment operation of components from component storage container 180 to stage 156, and operation of calculating scattered component quantity X and holdable component quantity Y are repeated multiple times, whereby multiple holdable probabilities Z are calculated. Then, holdable probability average $Z_{av}$ is calculated based on the multiple holdable probabilities Z. The average scattered component quantity X av corresponding to the holdable probability average value $Z_{av}$ calculated this time is also calculated. That is, the average value of the multiple scattered component quantities X used when the holdable probability average value $Z_{av}$ was calculated this time is calculated as the average scattered component quantity X av corresponding to the current holdable probability average value $Z_{av}$.

Note that, the holdable probability average value $Z_{av}$ calculated this time is a value after leaded components 410 supplied from component supply apparatus 88 to stage 156 have been added, and the holdable probability average value $Z_{av}$ calculated previously is a value before leaded components 410 have been added from component supply apparatus 88 to stage 156. Here, the previously calculated holdable probability average value $Z_{av}$ is described as first holdable probability average value $Z_{av1}$, and the currently calculated holdable probability average value $Z_{av}$ is described as second holdable probability average value $Z_{av2}$.

Further, individual control device 452 compares first holdable probability average value $Z_{av1}$ with second holdable probability average value $Z_{av2}$, and determines which value is higher. Here, the higher average value is stored in memory device 458 as the high probability average value $Z_{MAX}$. The average scattered component quantity $X_{av}$ corresponding to the high probability average value $Z_{MAX}$ is stored in association with the high probability average value $Z_{MAX}$. That is, the high probability average $Z_{MAX}$ for the average scattered component quantity $X_{av}$ is stored in memory device 458.

Further, third holdable probability average value $Z_{av3}$ is specified in order to search for an even higher holdable probability average value $Z_{a}$y. That is, leaded components 410 are added from component supply apparatus 88 to stage 156, and collection operation of leaded component 410 to component storage container 180 and replenishment operation from component storage container 180 to stage 156 are performed. Then, scattered component quantity X and holdable component quantity Y are calculated, and the ratio of holdable component quantity Y to scattered component quantity X (Y/X) is calculated as holdable probability Z.

Further, collection operation of leaded components 410 into component storage container 180, replenishment operation of components from component storage container 180 to stage 156, and operation of calculating scattered component quantity X and holdable component quantity Y are repeated multiple times, whereby multiple holdable probabilities Z are calculated. Then, third holdable probability average $Z_{av3}$ is calculated based on the multiple holdable probabilities Z. The average scattered component quantity $X_{av}$ corresponding to third holdable probability average value $Z_{av3}$ is also calculated. That is, the average value of the multiple scattered component quantities X used when the holdable probability average value $Z_{av}$ was calculated is calculated as the average scattered component quantity $X_{av}$ corresponding to the third holdable probability average value $Z_{av3}$.

Further, individual control device 452 compares high probability average value $Z_{MAX}$ with third holdable probability average value $Z_{av3}$, and determines which value is higher. Here, if high probability average value $Z_{MAX}$ stored in memory device 458 is higher than third holdable probability average value $Z_{av3}$, high probability average value $Z_{MAX}$ stored in memory device 458 is maintained. On the other hand, if third holdable probability average value $Z_{av3}$ is higher than high probability average value $Z_{MAX}$ stored in memory device 458, third holdable probability average value $Z_{av3}$ is stored in memory device 458 as a new high probability average value $Z_{MAX}$. That is, high probability average value $Z_{MAX}$ stored in memory device 458 is updated to third holdable probability average value $Z_{av3}$. Note that, when high-probability average $Z_{MAX}$ is updated, average scattered component quantity $X_{av}$ is also updated. That is, when high probability average value $Z_{MAX}$ is updated to third holdable probability average value $Z_{av3}$, average scattered component quantity X av corresponding to third holdable probability average value $Z_{av3}$ is stored in association with high probability average value $Z_{MAX}$.

Further, in order to search for a higher holdable probability average value $Z_{av}$, fourth holdable probability average value $Z_{av4}$ and fifth holdable probability average value $Z_{av5}$ are sequentially specified, and each time a holdable probability average value $Z_{av}$ is specified, high probability average value $Z_{MAX}$ stored in memory device 458 is compared with the specified holdable probability average value $Z_{av}$. Further, when specified holdable probability average value $Z_{av}$ is higher than high probability average value $Z_{MAX}$ stored in memory device 458, the high probability average value $Z_{MAX}$ stored in memory device 458 is updated to the newly specified holdable probability average value $Z_{av}$. Note that, whenever high probability average $Z_{MAX}$ is updated, average scattered component quantity $X_{av}$ is also updated. That is, each time high probability average value $Z_{MAX}$ is updated to a newly specified holdable probability average value $Z_{av}$, the average scattered component quantity $X_{av}$ corresponding to the specified holdable probability average value $Z_{av}$ is stored in association with the high probability average value $Z_{MAX}$.

In this manner, each time the scattered component quantity is gradually increased, the holdable probability average value $Z_{av}$ is specified, and the specified holdable probability average value $Z_{av}$ is compared with high probability average value $Z_{MAX}$ stored in memory device 458. Then, if the specified holdable probability average value $Z_{av}$ is higher than high probability average value $Z_{MAX}$, high probability average value $Z_{MAX}$ is updated to the specified holdable probability average value $Z_{av}$. This results in the highest high probability average $Z_{MAX}$. That is, with loose component supply device 32, each time the scattered component quantity is changed, high probability average value $Z_{MAX}$ is repeatedly specified, and the highest high probability average value $Z_{MAX}$ is specified by using a method of calculating the highest high probability average value $Z_{MAX}$, that is, a so-called iterative learning control method.

Further, each time high probability average value $Z_{MAX}$ is updated, average scattered component quantity $X_{av}$ corresponding to the updated high probability average value $Z_{MAX}$ is stored in memory device 458 in association with the high probability average value $Z_{MAX}$. Therefore, by replenishing leaded components 410 of average scattered component quantity $X_{av}$ stored in memory device 458 from component storage container 180 onto stage 156, the leaded components 410 replenished to stage 156 become pickup target components with the highest probability. That is, the average scattered component quantity $X_{av}$ stored in memory device 458 is the optimal quantity of leaded components 410 to be scattered onto stage 156. Therefore, the average scattered component quantity $X_{av}$ stored in memory device 458 is specified as the optimum component quantity.

Further, when the optimum component quantity is specified, leaded components 410 of the optimum component quantity are supplied from component storage container 180 when leaded components are supplied by loose component supply device 32. Specifically, after all the pickup target components have been picked up from stage 156, stage 156 is imaged, and the quantity of leaded components 410 remaining on stage 156 (hereinafter referred to as the "remaining component quantity") is calculated based on the image data. In this case, the calculation method used is the same as the calculation method used when scattered component quantity X is calculated.

Further, if the remaining component quantity is smaller than the optimum component quantity, the difference between the optimum component quantity and the remaining component quantity is supplied from component supply apparatus 88 to stage 156. In detail, after all of the pickup target components have been picked up from stage 156, component support member 150 moves from the exposed state to the stored state, upon which conveyor device 106 of component supply apparatus 88 is operated. Operation of conveyor device 106 is controlled such that leaded components 410 of a quantity that is the difference between the optimal component quantity and the remaining component quantity are supplied from component supply apparatus 88 to stage 156.

Then, component support member 150 is moved to the stored state, such that leaded components 410 of the optimum component quantity are accommodated in component storage container 180. Subsequently, component support member 150 moves from the stored state to the exposed state, and component storage container 180 swings while component support member 150 moves. Here, leaded components 410 of the optimum component quantity collected in component storage container 180 are replenished onto stage 156. As a result, the leaded components 410 supplied to stage 156 become pickup target components with the highest probability.

In this manner, loose component supply device 32 is controlled such that leaded components 410 of the optimum component quantity are supplied from component storage container 180 onto stage 156, whereby the quantity of times of the collection operation leaded components 410 to component storage container 180 and the replenishment operation of supplying leaded components 410 from component storage container 180 to stage 156 can be reduced. This makes it possible to reduce the time required for the collection work and the replenishment work. In addition, the load on leaded component 410 due to the collection operation and the replenishment operation can be reduced.

Note that, above-described specifying of the optimum component quantity is performed by an operator operating a predetermined button. That is, when the predetermined button is operated while supply of leaded components 410 is not being performed in loose component supply device 32, a command for specifying the optimal component quantity is output. Then, in response to the output of the command, the above-described specifying of the optimum component quantity is performed. As a result, the optimum component quantity can be specified by using the idle time during which loose component supply device 32 is not operating.

However, the above-described specifying of the optimum component quantity is performed when leaded component 410 are supplied to loose component supply device 32 even when the predetermined button is not operated. That is, when leaded components 410 are supplied by loose component supply device 32, if a pickup target component is not present on stage 156, leaded components 410 are collected in component storage container 180, and the leaded components 410 collected in component storage container 180 are replenished onto stage 156. Here, stage 156 is imaged, and the scattered component quantity X and holdable component quantity Y are calculated based on the image data. Then, holdable probability Z is calculated based on scattered component quantity X and holdable component quantity Y. In this manner, even when leaded components 410 are supplied by loose component supply device 32, by calculating holdable probability Z, the quantity of data becomes large, and a high probability average $Z_{MAX}$ with high accuracy can be specified.

Further, when optimum component quantity is specified, the information on the type of the lead component 410 used in specifying the optimum component quantity is stored in memory device 458 in association with the information on the optimum quantity of components. This is because the optimum component quantity differs depending on the shape, weight, and the like of the supplied components. This makes it possible to change the optimum component quantity in accordance with the supplied component, and to replenish many types of components in an optimum state.

Further, when the optimum component quantity is specified, individual control device 452 of loose component supply device 32 uploads the optimum component quantity and the information on the type of leaded component 410 used in specifying the optimum component quantity of components to server 460 in association with each other. In this manner, by uploading the optimum component quantity to server 460, many operators can access server 460 and share the optimum component quantity among multiple devices. This makes it possible to use the optimum component quantity even in other devices in which the optimum component quantity has not been identified.

Note that, loose component supply device 32 is an example of a component supply device. Stage 156 is an example of a stage. Camera 290 is an example of an imaging device. Suction nozzle 332 is an example of a holding tool. Individual control device 452 is an example of a control device.

Further, the present disclosure is not limited to the above example embodiments, and various changed or improved methods of embodiment are possible based on the knowledge of someone skilled in the art. Specifically, for example, in an embodiment above, camera 290 having a wide viewing angle is used, and imaging of the entire stage 156 can be performed at once, but if a camera having a narrow viewing angle is used, stage 156 may be divided into multiple areas and imaged multiple times.

Further, in an embodiment above, each time the holdable probability average value $Z_{av}$ is specified, two holdable probability average values $Z_{av}$ are compared to determine high probability average value $Z_{MAX}$, but high probability average value $Z_{MAX}$ may be determined by various methods. For example, after three or more holdable probability average values $Z_{av}$ are specified, the highest average value of the three or more holdable probability average values $Z_{av}$ may be determined as high probability average value $Z_{MAX}$. Further, for example, third specified holdable probability average value $Z_{av}$ may be compared with seventh specified holdable probability average value $Z_{av}$ to determine the high average value as high probability average value $Z_{MAX}$. That is, holdable probability average value $Z_{av}$ need not be compared in the order in which the holdable probability average values $Z_{av}$ are specified.

Further, in an embodiment above, scattered component quantity X is calculated based on the total area occupied by components, but scattered component quantity X may be calculated by various methods. For example, outlines of components in various orientations may be distinguished based on the image data, and scattered component quantity X may be calculated based on the distinguished outlines.

Further, in an embodiment described above, the total area occupied by components by subtracting the exposed area from the stage area, but the total area occupied by components may be calculated based on the captured image data. Specifically, for example, when the color of stage 156 is white and the color of leaded component 410 is black, a black portion may be extracted based on the captured image data, and the area of the extracted portion may be calculated as the total area occupied by components.

Further, in an embodiment above, holdable probability average value $Z_{av}$ and high probability average value $Z_{MAX}$ are compared each time the scattered component quantity is gradually increased, but holdable probability average value $Z_{av}$ and high probability average value $Z_{MAX}$ may be compared each time the scattered component quantity is gradually decreased. That is, when there are no more pickup target components, components may be accommodated in component storage container 180, and scattered on stage 156 again, and then holdable probability average value $Z_{av}$ may be compared with high probability average value $Z_{MAX}$.

Further, in an embodiment above, after imaging the leaded components 410 scattered on stage 156, leaded components 410 are supplied from component supply apparatus 88 when it is determined that the quantity of leaded components 410 is insufficient, but the quantity of a single supply of leaded components 410, in more detail, the distance over which conveyor belt 112 of conveyor device 106 is operated, may be fixed for each component type.

Further, since suction nozzle 332 can be positioned and stopped at angles between the non-pivoted position and the pivoted position, the four orientations and the orientations of the pickup target components can be further divided and registered.

Further, it is easy to replace suction nozzle 332, which is a holding tool, with a gripping chuck.

Also, an embodiment above is applied to leaded components 410, but the disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
156: stage;
290: camera (imaging device);
332: suction nozzle (holding tool);
452: individual control device (control device)

The invention claimed is:

1. A component feeding system comprising:
a stage configured to support components in a scattered state with random orientations;
a holding tool configured to pick up and hold the components scattered on the stage;
an imaging device configured to image the components scattered on the stage; and
a control device configured to:
acquire, based on image data of the imaging device, a holdable component quantity that is a quantity of components that are in an orientation that can be picked up by the holding tool from among the components scattered on the stage and a scattered component quantity that is a quantity of the components scattered on the stage,
acquire multiple first holdable component quantities that are of first instances of the holdable component quantity and multiple first scattered component quantities that are first instances of the scattered component quantity,
calculate first ratios of the first holdable component quantities to the first scattered component quantities,
calculate a first average ratio which is an average of the first ratios,
increase or decrease a quantity of the components scattered on the stage and acquire multiple second holdable component quantities that are second instances of the holdable component quantity and multiple second scattered component quantity that are second instances of the scattered component quantity,
calculate second ratios of the second holdable component quantities to the second scattered component quantities,
calculate a second average ratio which is an average of the second ratios,
compare the first average ratio and second average ratio to determine which is higher and set that ratio as a high ratio, and
set an average of the one of the first scattered component quantities and the second scattered component quantities associated with the high ratio as a high ratio component quantity.

2. The component feeding system according to claim 1, wherein the control device is further configured to:
after acquiring the second holdable component quantities, increase or decrease a quantity of the components scattered on the stage, acquire multiple third scattered component quantities that are third instances of the scattered component quantity and multiple third holdable component quantities that are third instances of the holdable component quantity,
calculate third ratios of the third holdable component quantities to the third scattered component quantities, and in a case in which an average of the third ratios is higher than the high ratio, update the high ratio component quantity to an average of the third scattered component quantities.

3. The component feeding system according to claim 1, wherein the control device is configured to memorize a type of the components scattered on the stage linked to the high ratio component quantity.

* * * * *